United States Patent
Yu (10) Patent No.: US 6,355,513 B1
(45) Date of Patent: Mar. 12, 2002

(54) ASYMMETRIC DEPLETION REGION FOR NORMALLY OFF JFET

(75) Inventor: Ho-Yuan Yu, Saratoga, CA (US)

(73) Assignee: Lovoltech, Inc., Santa Clara, CA (US)

(*) Notice: Subject to any disclaimer, the term of this patent is extended or adjusted under 35 U.S.C. 154(b) by 0 days.

(21) Appl. No.: 09/669,480

(22) Filed: Sep. 25, 2000

Related U.S. Application Data (63) Continuation-in-part of application No. 09/430,500, filed on Oct. 29, 1999, now Pat. No. 6,251,716.

(51) Int. Cl.[7] ............................................. H01L 21/337
(52) U.S. Cl. ...................... 438/186; 438/186; 438/135; 438/193; 438/194; 438/195; 257/133; 257/134; 257/136; 257/177; 257/256; 257/287
(58) Field of Search .................................. 438/186, 135, 438/193–195; 257/256, 260–67, 133–36, 287; 326/68, 112, 430

(56) References Cited

U.S. PATENT DOCUMENTS

| | | | | |
|---|---|---|---|---|
| 4,506,282 A | * | 3/1985 | Baliga | 357/43 |
| 4,523,111 A | * | 6/1985 | Baliga | 307/574 |
| 4,645,957 A | * | 2/1987 | Baliga | 307/570 |
| 4,700,461 A | * | 10/1987 | Choi et al. | 437/41 |
| 4,750,023 A | * | 6/1988 | Shannon | 357/23.3 |
| 5,396,085 A | * | 3/1995 | Baliga | 257/77 |

OTHER PUBLICATIONS

Kang et al., "A new type of transsistor CBT" IEEE Transactions of electron devices vol. 40 Oct. 1993 p. 1805–1812.*

* cited by examiner

*Primary Examiner*—Matthew Smith
*Assistant Examiner*—Granvill Lee
(74) *Attorney, Agent, or Firm*—Wagner, Murabito & Hao LLP

(57) ABSTRACT

A semiconductor device efficiently providing the DC currents required in both discrete and integrated circuits operated at low DC supply voltages. The device disclosed in the present invention is an asymmetrical, enhancement mode, Junction Field Effect Transistor (JFET). The device consists of an epitaxial layer on the surface of a substrate, both of which are doped with the same polarity. The epitaxial layer has a graded doping profile with doping density increasing with distance from the substrate. A grill-like structure is constructed within the upper and lower bounds of, and extending throughout the length and width of the epitaxial layer, and is doped with a polarity opposite to that of the epitaxial layer. A first electrical connection made to the exposed side of the substrate is defined as the drain electrode. A second electrical connection made to the exposed surface of the epitaxial layer is defined as the source electrode. A third electrical connection made to the grill-like structure is defined as the gate electrode. The asymmetrical, enhancement mode JFET is produced as a three terminal device, with a minimal number of elements and a simplified manufacturing process. With the gate electrode left open circuited, the p-n junction depletion regions between the gate and the epitaxial layer prevent the conduction of current between source and drain. A voltage applied between gate and source with a polarity to forward bias the p-n junctions will reduce the depletion regions to form conduction channels which allow current conduction between source and drain.

21 Claims, 8 Drawing Sheets

ASYMMETRIC DEPLETION REGION FOR NORMALLY OFF JFET

RELATED APPLICATIONS

The following U.S. patent application is a continuation-in-part of Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, filed Oct. 29, 1999, now U.S. Pat. No. 6,251,716 is incorporated herein by reference for all purposes.

BACKGROUND OF THE INVENTION

1. Field of the Invention

The present invention relates generally to the field of active semiconductor devices. More specifically, the present invention relates to active devices referred to as normally off Junction Field Effect Transistors (JFET). More particularly, the present invention relates to a novel device structure for an asymmetrical, normally off JFET useful in low voltage and high current density applications.

2. Related Art

The increasing trend toward lower supply voltages for active semiconductor devices and Integrated Circuits (IC's) has accelerated the search for more efficient low voltage power sources. Conventional power supplies utilizing silicon diode rectifiers are unacceptable in low voltage applications due to the excessive voltage drop across the forward biased diode terminals. Power loss in the diodes becomes excessive when they are used as rectifiers in a DC power supply designed for a terminal voltage as low as 3.0 volts.

Semiconductor diodes are combined with active devices to form circuits capable of producing low value DC supply voltages, but such circuits are generally not capable of handling the large currents frequently required. They usually exhibit a fairly large internal resistance and as such are very inefficient power sources. Furthermore, the number and complexity of steps required in the processing of this type of circuit as an IC also increases with the number of devices included.

Active semiconductor devices are used as switches in circuit arrangements producing DC power supply voltages, as for example in switched mode power supplies. Junction Field Effect Transistors (JFET) are frequently used as switches because they are easily switched between an ON or conducting state and an OFF or non-conducting state. Most importantly, the current carriers in a JFET are all majority carriers which results in short switching times. However, when operated at lower voltages, JFETs exhibit an internal resistance in the ON state that make them unsatisfactory and inefficient in applications requiring large currents.

In U.S. Pat. No. 4,523,111 entitled "Normally-Off Gate-Controlled Electric Circuit with Low On-Resistance", Baliga disclosed a JFET serially connected to an Insulated Gate Field Effect Transistor (IGFET). The ON resistance of this circuit is the sum of the JFET resistance and the IGFET resistance. As a result, the ON resistance is too large and therefore unsatisfactory for low voltage operations requiring large currents.

In a similar invention disclosed in U.S. Pat. No. 4,645,957 entitled "Normally Off Semiconductor Device with Low On-Resistance and Circuit Analogue" by Baliga, a JFET is serially connected to a Bipolar Junction Transistor (BJT). The ON resistance is the sum of the JFET and the BJT which is again too large for low voltage applications requiring large currents.

In an invention disclosed in U.S. patent application Ser. No. 60/167,959, "STARTER DEVICE FOR NORMALLY OFF JFETS", Ho-Yuan Yu, filed Nov. 29, 1999, a normally OFF JFET is combined in parallel with one or more active devices defined as starter devices. In a first case, a BJT acting as the starter device is connected in parallel with the normally OFF JFET. In a second case, a Metal Oxide Silicon Field Effect Transistor (MOSFET) acting as the starter device is connected in parallel with the normally OFF JFET. In a third case, three normally OFF JFETs are connected serially as a starter device, and are then connected in parallel with the normally OFF JFET. Each of the resulting structures provide high current carrying capacity at low voltage levels, but still exhibit a larger than desired internal resistance in the ON or conducting state. Furthermore, the required starter devices all necessitate an increase in the number of steps and in the complexity of the IC processing recipe.

SUMMARY OF THE INVENTION

Accordingly, what is needed is a semiconductor device that can efficiently supply the DC currents required in both discrete and integrated circuits being operated at low DC supply voltages. What is further needed is a semiconductor device that has a very low internal resistance such that the power dissipated in the device itself is only a fraction of that delivered to a connected load. What is needed yet is a semiconductor device that exhibits short switching times between an ON or conducting state and an OFF or non-conducting state. What is also needed is a semiconductor device composed of a minimal number of elements such that the manufacturing process for the device is simplified. The present invention provides these advantages and others not specifically mentioned above but described in the sections to follow.

A semiconductor device that can efficiently supply the DC currents required in both discrete and integrated circuits being operated at low DC supply voltages is disclosed. The device disclosed in the present invention is an asymmetrical, enhancement mode, Junction Field Effect Transistor (JFET). The device consists of an epitaxial layer on the surface of a substrate, both of which are doped with the same polarity. The epitaxial layer has a graded doping profile with doping density increasing with distance from the substrate. A grill-like structure is constructed within the upper and lower bounds of, and extending throughout the length and width of the epitaxial layer, and is doped with a polarity opposite to that of the epitaxial layer. A first electrical connection made to the exposed side of the substrate is defined as the drain electrode. A second electrical connection made to the exposed surface of the epitaxial layer is defined as the source electrode. Finally, a third electrical connection made to the grill-like structure is defined as the gate electrode. The asymmetrical, enhancement mode JFET is thus produced as a three terminal device, with a minimal number of elements and a simplified manufacturing process.

In integrated circuit applications, an asymmetrical, enhancement mode JFET can be manufactured in a well located within and doped with a polarity opposite to the epitaxial layer. A p-channel JFET can be produced in a p-well located within an n-type epitaxial layer. Likewise, an n-channel JFET can be produced in an n-well located within a p-type epitaxial layer. Thus it is possible to produce an integrated circuit having both n-channel and p-channel JFETS.

With no applied difference in electric potential between the gate and either the source or the drain, the built-in p-n junction depletion regions surrounding the grill-like gate structure will form a continuous depletion region that isolates the source region from the drain region. The result is a normally OFF or enhancement mode JFET, since no electric current can exist between source and drain. Application of an electric potential difference that will forward bias the p-n junction between gate and either source or drain will reduce the extent of the p-n junction depletion regions to produce conducting channels between source and drain, thus switching the JFET into the ON or conducting state.

The JFET disclosed in the present invention is referred to as asymmetrical since the graded doping profile of the epitaxial layer causes the p-n junction depletion region on the source side of the gate structure to be narrower than on the drain side. As a result, the gate structure can be located physically closer to the source lead which shortens the conduction channels. The result is a reduction in the electrical resistance of the channels between source and drain when the JFET is operating in the ON or current conducting state. By these means, the time required for switching the JFET between an ON or conducting state and an OFF or non-conducting state is also shortened. Furthermore, because of the asymmetrical structure and an initial parasitic bipolar transistor action, this asymmetrical JFET can be switched between states without the requirement of any starter device connected between the source and the drain. Elimination of the starter device required with previous devices greatly simplifies both the structure and the manufacturing process of the JFET disclosed in the present invention.

DETAILED DESCRIPTION OF THE INVENTION

In the following detailed description of the present invention, an asymmetric, enhancement mode JFET, numerous specific details are set forth in order to provide a through understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
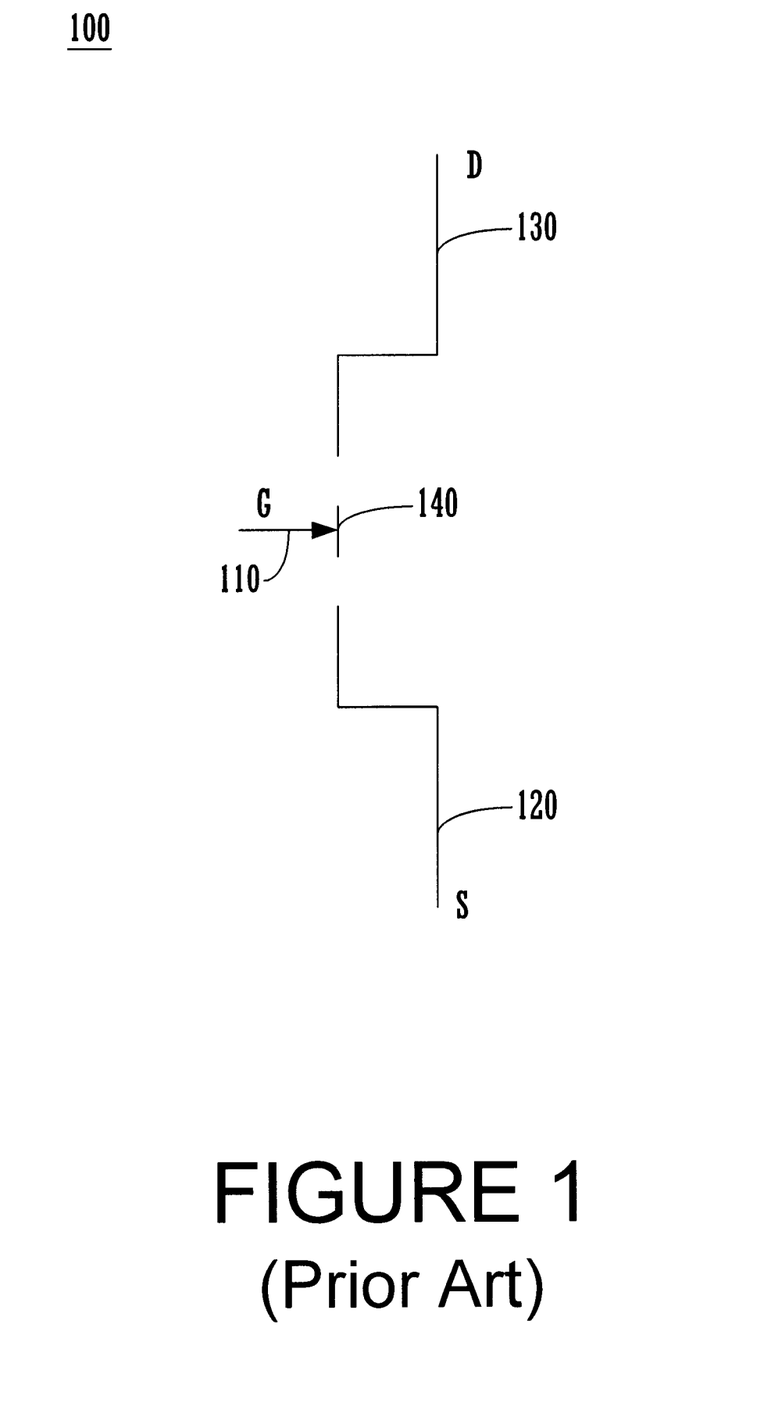
FIG. 1 shows the electronic symbol used in prior art to represent an n-channel symmetrical, normally off Junction Field Effect Transistor (JFET).

FIG. 1 shows the electronic symbol 100 used in prior art to represent an n-channel, symmetrical, normally off Junction Field Effect Transistor (JFET). The three terminals of this JFET are the gate 110, the source 120 and the drain 130, hereafter abbreviated on such symbols as G, S and D respectively. The broken line 140 between source and drain denotes a normally off or enhancement mode device. Location of the gate in the center portion of the broken line signifies that this is a symmetrical device. In this case, symmetrical means the physical construction of the device is such that the source and drain leads can be interchanged in any circuit configuration without affecting the operation of the circuit.

Figure 2:
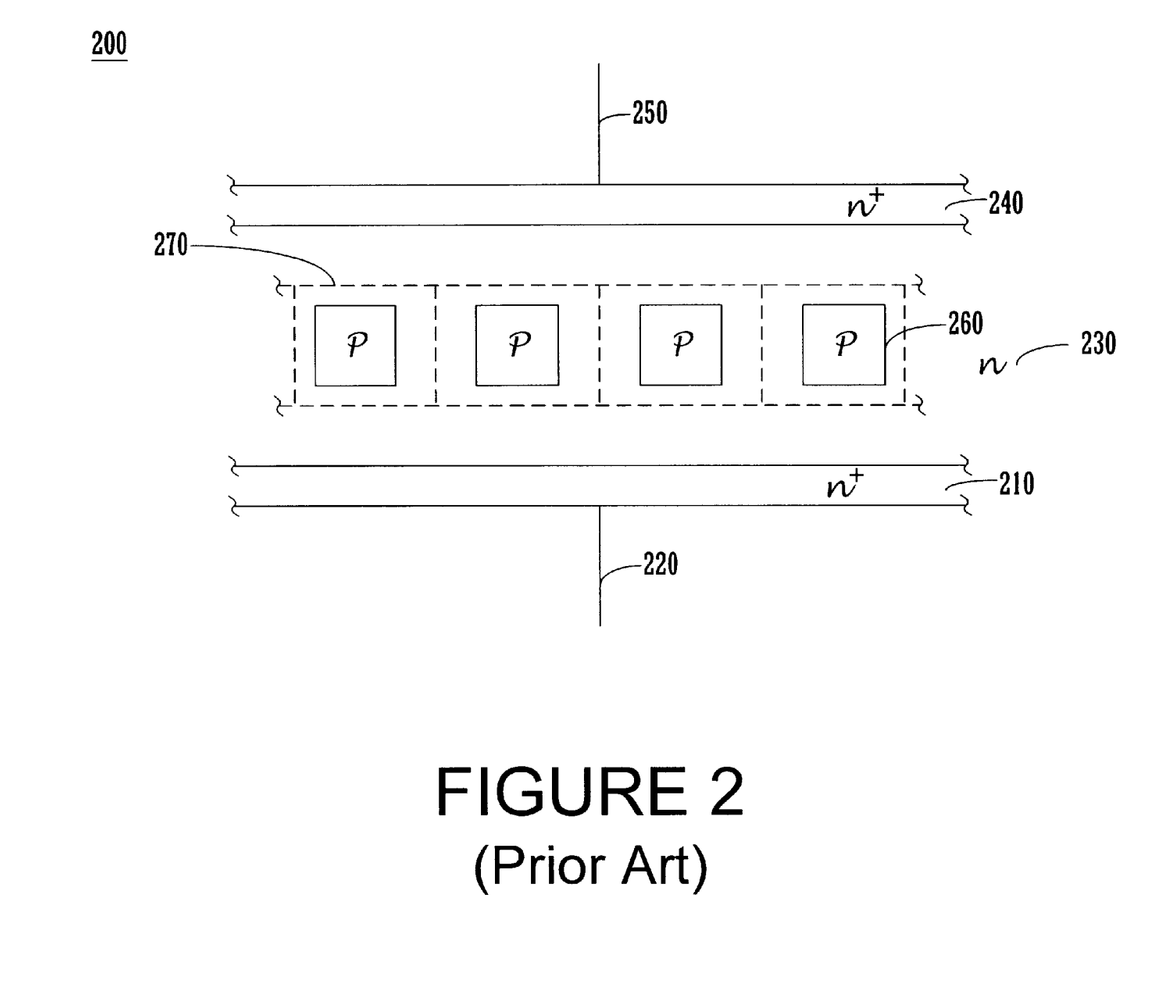
FIG. 2 is a cross-sectional view of a normally off, n-channel JFET as described in previously cited pending patent application Ser. No. 09/430,500 in the off or non-conducting state.

FIG. 2 is a cross-sectional view of a symmetrical, normally off, n-channel JFET 200 as described in previously cited pending patent application Ser. No. 09/430,500. The substrate 210 serves as a structural base upon which the JFET is formed. The n+ symbol located in the substrate region shows an elevated n-type doping density necessary to form good ohmic contact with the drain electrode 220. The epitaxial region 230 is doped n-type with a doping density less than that of the substrate as signified by the letter n located within the epitaxial region. A region having an elevated n-type doping density 240 is formed on the upper surface of the epitaxial layer in order to form good ohmic contact with the source electrode 250. Elements of the grill-like gate structure 260 are exemplary rectangular areas doped p-type and distributed throughout the mid-section of the epitaxial region. The dashed lines surrounding the gate elements 270 represent the extent of the built-in p-n junction depletion regions that exist between the p-type gate elements and the n-type epitaxial region. The depletion regions extend an equal amount above and below the p-type gate structure and the JFET is seen to be symmetrical in cross-section. The extent of the built-in p-n junction depletion regions is great enough to provide a continuous depletion region between adjacent elements of the grill-like gate structure. The drain lead is thus isolated from the source lead by this continuous depletion region which therefore prevents the existence of an electric current between the source and the drain. This is then the off or non-conducting state of the JFET that exists naturally when the gate electrode is open-circuited. Thus the JFET is termed a normally off or enhancement mode device.

Figure 3:
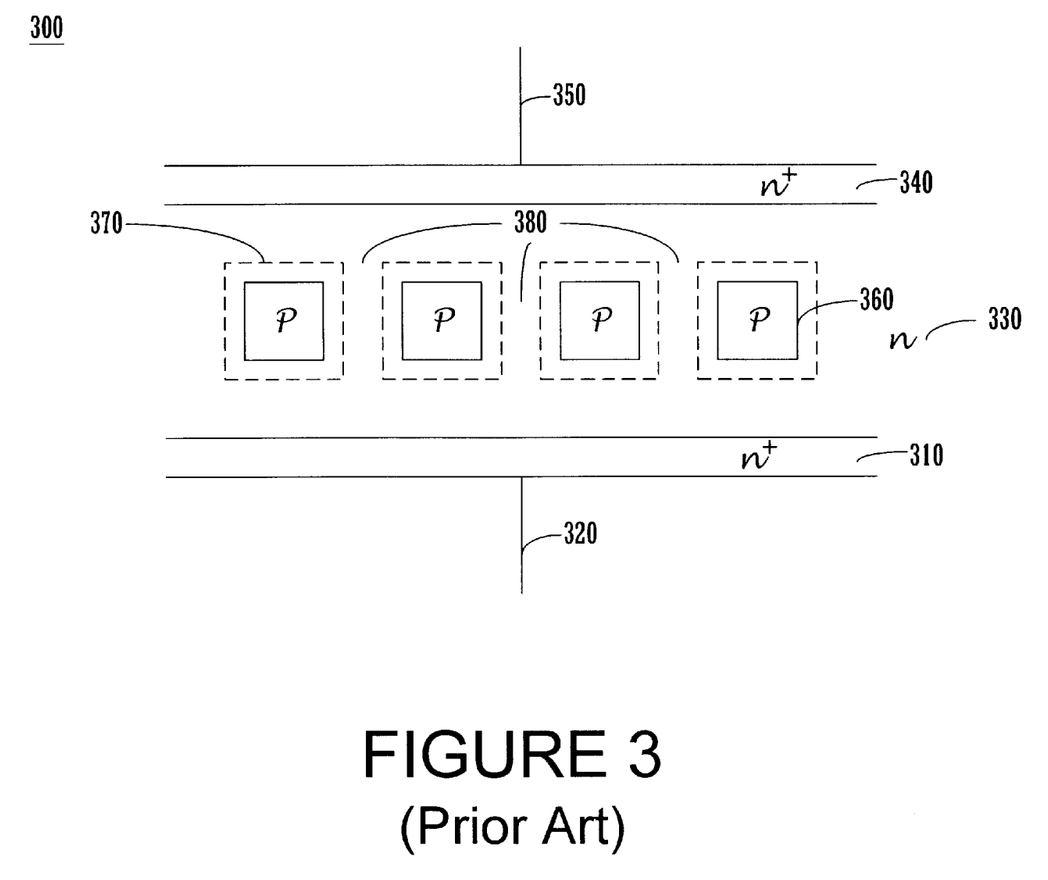
FIG. 3 is a cross-sectional view of a normally off, n-channel JFET as described in previously cited pending patent application Ser. No. 09/430,500, illustrating the formation of current carrying channels present in the on or conducting state.

FIG. 3 is a cross-sectional view of a symmetrical, normally off, n-channel JFET 300 as described in previously cited pending patent application Ser. No. 09/430,500. This figure illustrates the creation of current conducting channels formed by the application of a DC voltage between the gate 360 and the source 350 with a polarity that will forward bias the p-n junctions between the gate elements 360 and the epitaxial region 330. A forward bias thus applied will reduce the extent of the p-n junction depletion regions 370 such that they no longer extend the entire distance between the elements of the gate structure. As a result, low resistance paths 380 or channels capable of conducting an electric current between the source and the drain are formed in the epitaxial region between the gate elements. Under this condition, the JFET is operating in the on or current conducting state. Because of the device symmetry, a similar result will obtain if the source and drain leads are interchanged.

Figure 4:
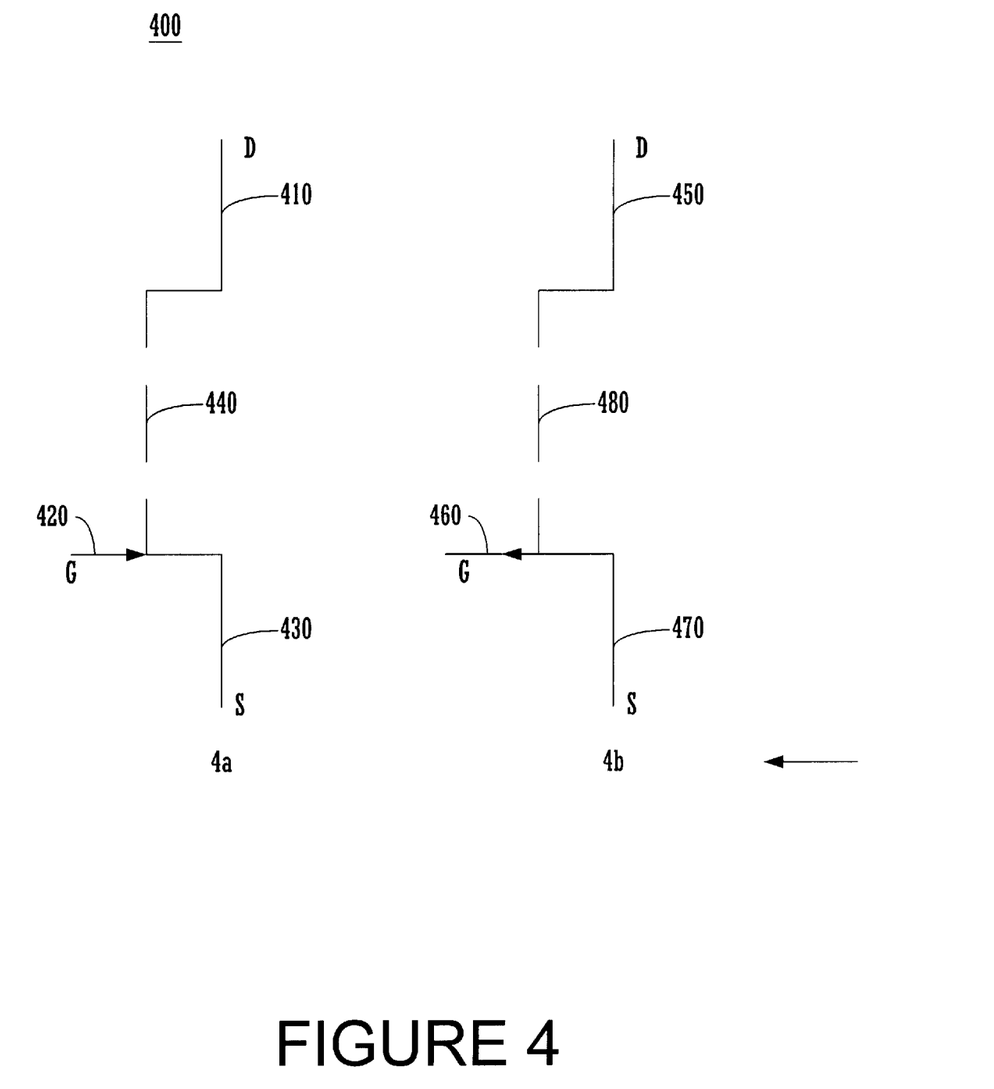
FIG. 4a shows the electronic symbol used in the present invention to represent an n-channel, asymmetrical, normally off JFET.
FIG. 4b shows the electronic symbol used in the present invention to represent a p-channel, asymmetrical, normally off JFET.

FIG. 4 shows the electronic symbols used in the present invention to represent asymmetrical, normally off JFETs 400. In FIG. 4a, the gate lead 420 is directly opposite the source lead 430 which identifies this as an asymmetrical device. The direction of the arrow on the gate lead signifies an n-channel JFET. The broken line 440 between source and drain 410 denotes a normally off or enhancement mode device. In FIG. 4b, the gate lead 460 is directly opposite the source lead 470 which identifies this as an asymmetrical device. The direction of the arrow on the gate lead signifies a p-channel JFET. The broken line 480 between source and drain 450 denotes a normally off or enhancement mode device.

Figure 5:
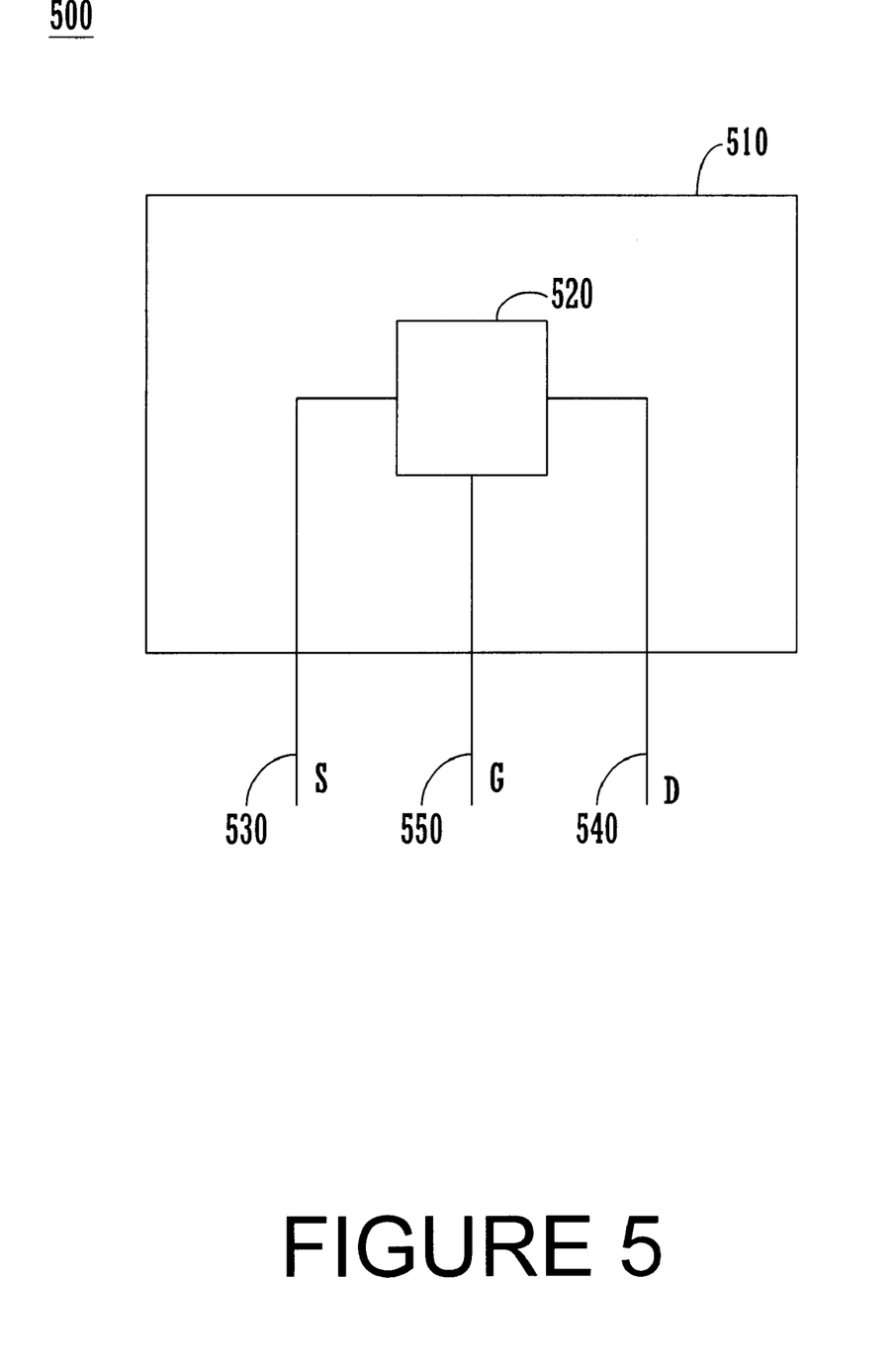
FIG. 5 is an exemplary cross-sectional view showing the physical construction of an asymmetrical, normally off JFET according to the present invention.

FIG. 5 is an exemplary cross-sectional view 500 showing the physical construction of an asymmetrical, normally off JFET according to the present invention. The housing 510 is a structure to provide physical support for the JFET as well as environmental protection. The die or chip 520 is the section of semiconductor representing the processed JFET. An electrical connection called the source 530 is provided between the more heavily doped side of the epitaxial region of the chip and a point outside the housing. A second electrical connection called the drain 540 is provided between the substrate of the chip and a point outside the housing. A third electrical connection called the gate 550 is provided between the grill-like gate structure formed within the chip and a point outside the housing.

Figure 6:
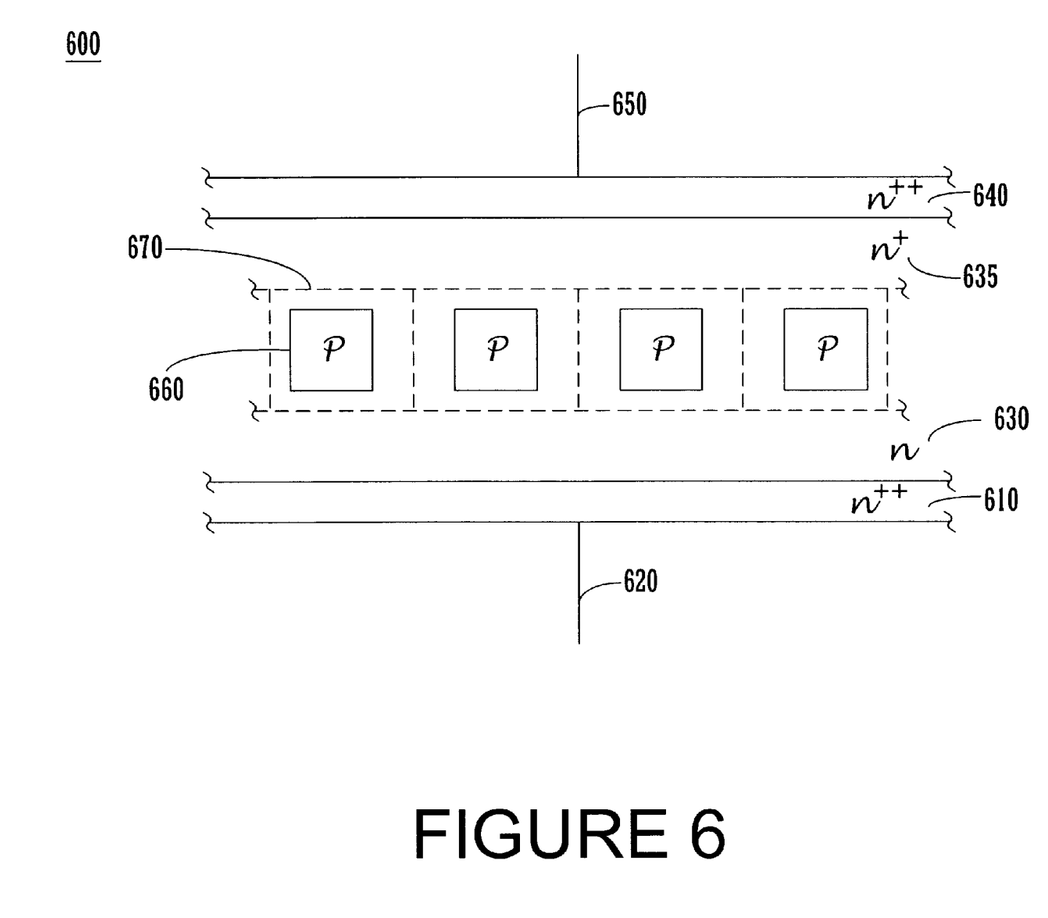
FIG. 6 is a cross-sectional view showing an n-channel, asymmetrical, normally off JFET in a non-conducting (OFF) state according to the present invention.

FIG. 6 is a cross-sectional view 600 showing an n-channel, asymmetrical, normally off JFET in a non-conducting (OFF) state according to the present invention. The substrate 610 serves as a structural base upon which the JFET is formed. The n++ symbol located in the substrate region shows an elevated n-type doping density necessary to form good ohmic contact with the drain electrode 620. In one embodiment of the present invention, this region is doped to have a resistivity between 0.002 ohm-cm and 0.05 ohm-cm.

The epitaxial region closest to the substrate 630 is doped n-type with a doping density less than that of the substrate as signified by the letter n located within the epitaxial region. In one embodiment of the present invention, the epitaxial region between the substrate and the elements of the grill-like gate structure 660 is doped to have a resistivity of about 0.1 to 5.0 ohm-cm.

The upper portion of the epitaxial region 635 is doped n-type with a doping density higher than that of the lower portion of the epitaxial layer as signified by the letter n+ located within that region. In one embodiment of the present invention, the epitaxial region between the elements of the grill-like gate structure 660 and the upper limit of the epitaxial region is doped to have a resistivity of between 0.05 and 1.0 ohm-cm.

A region signified by the symbol n++ and having an elevated n-type doping density 640 is formed on the upper surface of the epitaxial layer in order to form good ohmic contact with the source electrode 650. In one embodiment of the present invention, this region is doped to have a resistivity of between 0.002 ohm-cm and 0.05 ohm-cm.

Elements of the grill-like gate structure 660 are exemplary rectangular areas doped p-type and distributed throughout the mid-section of the epitaxial region. In one embodiment of the present invention, the p-type regions forming the grill-like structure of the gate is accomplished by doping with between $10^{17}$ and $10^{19}$ boron atoms per cubic centimeter.

The dashed lines surrounding the gate elements 670 represent the extent of the built-in p-n junction depletion regions that exist between the p-type gate elements and the n-type epitaxial region. In the present invention, the depletion regions are not symmetrical about the grill-like structure of the gate. Because the epitaxial region between the gate and the source is more heavily doped than the epitaxial region between the gate and the drain, the depletion region between gate and drain extends a greater distance. The JFET thus described in the present invention is asymmetrical in cross-section. However, the extent of the built-in p-n junction depletion regions is still great enough to provide a continuous depletion region between adjacent elements of the grill-like gate structure. The drain lead is thus isolated from the source lead by this continuous depletion region which therefore prevents the existence of an electric current between the source and the drain. This is then the off or non-conducting state of the JFET that exists naturally when the gate electrode is open-circuited. Thus the JFET is termed a normally off or enhancement mode device.

Figure 7:
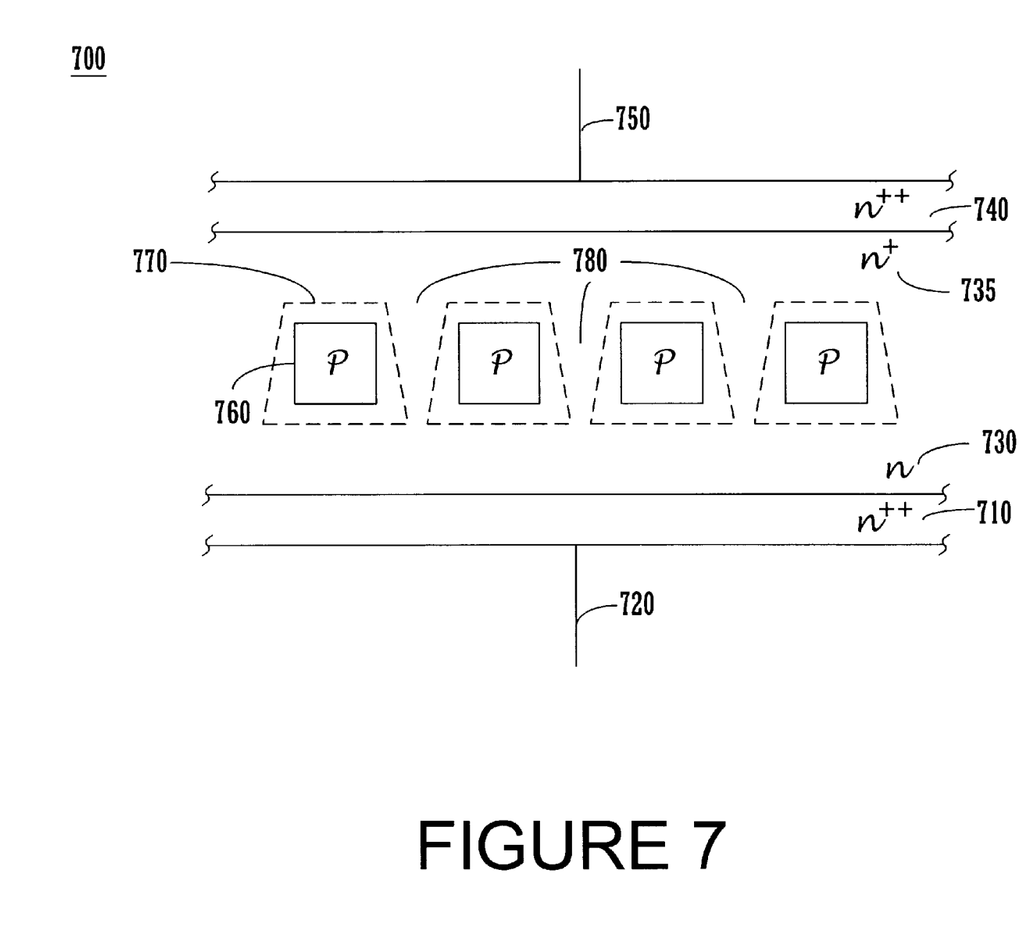
FIG. 7 is a cross-sectional view showing an n-channel, asymmetrical, normally off JFET in a conducting (ON) state according to the present invention.

FIG. 7 is a cross-sectional view showing an n-channel, asymmetrical, normally off JFET in a conducting (ON) state according to the present invention. This figure illustrates the existence of current conducting channels formed by the application of a DC voltage between the gate 760 and the source 750 with a polarity that will forward bias the p-n junctions between the gate elements 760 and the epitaxial region 730 and 735. A forward bias thus applied will reduce the extent of the p-n junction depletion regions such that they no longer extend across the entire distance between the elements of the gate structure. As a result, low resistance paths 780 or channels capable of conducting an electric current between the source and the drain are formed in the epitaxial regions between the gate elements. Under this condition, the JFET is operating in the on or current conducting state.

Since the epitaxial region between the gate and the source is more heavily doped than the epitaxial region between the gate and the drain, it is possible to place the grill-like gate structure closer to the source side of the epitaxial layer. The distance between the source and drain leads can then be decreased by decreasing the depth of the epitaxial layer. When operated in the on state, the current paths formed between source and drain are shorter in length and they exist in more heavily doped epitaxial regions. As a result, the internal resistance of the JFET in the on or current conducting state is greatly reduced. The low value of channel resistance means the JFET described in the present invention is capable of conducting large currents without developing excessive voltage between source and drain. Because of the asymmetric structure and the parasitic bipolar transistor action, this JFET can be switched with a gate to source forward bias voltage less than one volt, which eliminates the need for a starter device. Such are the requirements of a device for use in low voltage, high current applications.

Figure 8:
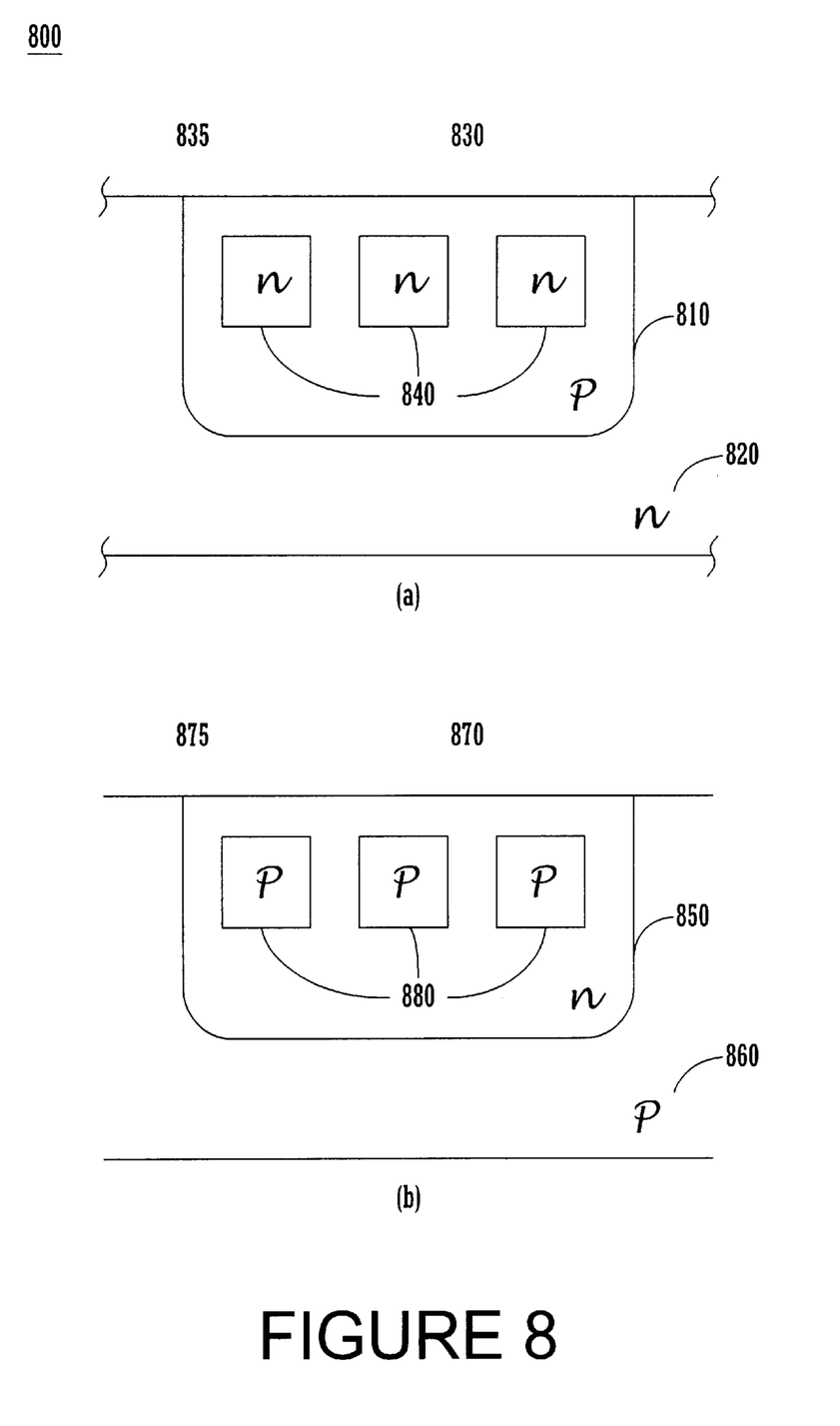
FIG. 8a is an exemplary cross-sectional view showing the physical construction of a p-channel, asymmetrical, normally off JFET in a p-well located in an n-type epitaxial layer according to the present invention.
FIG. 8b is an exemplary cross-sectional view showing the physical construction of an n-channel, asymmetrical, normally off JFET in an n-well located in a p-type epitaxial layer according to the present invention.

It is to be noted that the above discussion has been presented in terms of an n-channel JFET, but it is equally representational of a p-channel JFET by simply reversing the doping polarities. In integrated circuit applications, an asymmetrical, enhancement mode JFET can be manufactured in a well located within and doped with a polarity opposite to the epitaxial layer. An exemplary illustration in FIG. 8a shows a p-channel JFET produced in a p-well 810 located within an n-type epitaxial layer 820. The source lead 830 and the drain lead 835 are connected to the surface of the p-well. The grill-like gate structure 840 is doped n-type. Similarly, FIG. 8b is an exemplary illustration of an n-channel JFET produced in an n-well 850 located within a p-type epitaxial layer 860. The source lead 870 and the drain lead 875 are connected to the surface of the n-well. The grill-like gate structure 880 is doped p-type. Utilization of n-wells and/or p-wells makes it is possible to produce integrated circuits having both n-channel and p-channel JFETS.

The preferred embodiment of the present invention, an asymmetric, enhancement mode JFET, is thus described. While the present invention has been described in particular embodiments, it should be appreciated that the present invention should not be construed as limited by such embodiments, but rather construed according to the below claims.

What is claimed is:

1. An asymmetric, enhancement mode Junction Field Effect Transistor, JFET, comprising:
   a) a structural and environmental housing;
   b) a semiconductor die contained within said housing;
   c) elements manufactured on said die forming said JFET;
   d) a first electrical connection to said die, defined as the source;
   e) a second electrical connection to said die, defined as the drain, and
   f) a third electrical connection to said die, defined as the gate.

2. An asymmetric, enhancement mode JFET according to claim 1 wherein electric current is restricted between said source and said drain without an applied difference in electric potential between said gate and either said source or said drain.

3. An asymmetric, enhancement mode JFET according to claim 1 wherein said JFET will conduct an electric current between said source and said drain with the application of a difference in electric potential between said gate and said drain.

4. An asymmetric, enhancement mode JFET according to claim 1 wherein said JFET will conduct an electric current between said source and said drain with the application of a difference in electric potential between said gate and said source.

5. An asymmetric, enhancement mode JFET according to claim 1 wherein said JFET can be switched between a first OFF or non-current conducting state, and a second ON or current conducting state, by means of a difference in electric potential applied between said gate and said source.

6. An asymmetric, enhancement mode JFET according to claim 1 wherein said JFET can be switched between a first OFF or non-current conducting state, and a second ON or current conducting state, by means of a difference in electric potential applied between said gate and said drain.

7. An asymmetric, enhancement mode JFET according to claim 1 wherein operation in said OFF state establishes an electrical resistance between said source and said drain great enough to prevent conduction of electric current between said source and said drain.

8. An asymmetric, enhancement mode JFET according to claim 1 wherein operation in said ON state establishes an electrical resistance between said source and said drain small enough to conduct electric current without generating unacceptable difference in electric potential between said source and said drain.

9. A semiconductor device comprising:
   a) a doped silicon substrate;
   b) an epitaxial layer on the surface of said substrate, said epitaxial layer doped with the same polarity as said substrate and having a graded doping profile with doping density increasing with distance from said substrate;
   c) a grill-like structure located within the upper and lower bounds of, and extending throughout the width and length of said epitaxial layer, said structure doped with a polarity opposite of said epitaxial layer;
   d) an electrical connection to the exposed surface of said epitaxial layer, defined as the source electrode;
   e) an electrical connection to said substrate, defined as the drain electrode, and
   f) an electrical connection to said grill-like structure, defined as the gate electrode.

10. A semiconductor device according to claim 9 wherein said epitaxial layer and said substrate are doped n-type, and said grill-like structure is doped p-type.

11. A semiconductor device according to claim 9 wherein said epitaxial layer and said substrate are doped p-type, and said grill-like structure is doped n-type.

12. A semiconductor device according to claim 9 wherein the built-in p-n junction depletion regions produced between said grill-like structure and said epitaxial region form a continuous depletion region which insulates said source electrode from said drain electrode thereby preventing the conduction of electric current between said drain and said source electrodes.

13. A semiconductor device according to claim 9 wherein a difference in electric potential applied between said gate and said source will reduce the extent of said built-in p-n junction depletion regions and form current conducting channels through said grill-like structure allowing the conduction of electric current between said drain and said source electrodes.

14. A semiconductor device according to claim 9 wherein a difference in electric potential applied between said gate and said drain will reduce the extent of said built-in p-n junction depletion regions and form current conducting channels through said grill-like structure allowing the conduction of electric current between said drain and said source electrodes.

15. A semiconductor device according to claim 9 b) wherein said graded doping profile results in an asymmetrical normally off JFET that can be switched between said ON and said OFF states without the use of a starter device connected between said source and said drain.

16. A semiconductor device according to claim 15 wherein the manufacturing process is greatly simplified.

17. A semiconductor device according to claim 9 b) wherein said graded doping profile results in an asymmetrical normally off JFET having a reduced current path resistance between said source and said drain.

18. A semiconductor device according to claim 9 b) wherein said graded doping profile results in an asymmetrical normally off JFET that switches between said OFF and said ON states in a shorter time.

19. A semiconductor device according to claim 9 b) wherein said graded doping profile results in an asymmetrical normally off JFET having reduced conduction channel length between said source and said drain.

20. A semiconductor device according to claim 9 wherein said semiconductor device is manufactured using germanium, silicon, silicon compounds or combinations of periodic table column III and column V elements, III–V compounds.

21. An integrated circuit comprising:
 a) a doped silicon substrate;
 b) an epitaxial layer on the surface of said substrate, said epitaxial layer doped with the same polarity as said substrate and having a graded doping profile with doping density increasing with distance from said substrate;
 c) a well located within and doped with a polarity opposite to said epitaxial layer; said well having a graded doping profile with doping density increasing with distance from said substrate;
 d) a grill-like structure located within the upper and lower bounds of, and extending throughout a portion of said well, said structure doped with a polarity opposite of said well;
 e) a first electrical connection to the exposed surface of said well, defined as the source electrode;
 f) a second electrical connection to the exposed surface of said well, defined as the drain electrode, and
 g) an electrical connection to said grill-like structure located within said well, defined as the gate electrode.

* * * * *